United States Patent
Sinha et al.

(10) Patent No.: US 9,209,747 B1
(45) Date of Patent: Dec. 8, 2015

(54) CRYSTAL OSCILLATOR WITH RESISTORLESS FEEDBACK BIASING

(71) Applicants: Anand Kumar Sinha, Noida (IN); Ashish Ojha, Lucknow (IN); Ateet Omer, Kanpur (IN)

(72) Inventors: Anand Kumar Sinha, Noida (IN); Ashish Ojha, Lucknow (IN); Ateet Omer, Kanpur (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/614,427

(22) Filed: Feb. 5, 2015

(51) Int. Cl.
*H03B 5/36* (2006.01)

(52) U.S. Cl.
CPC ............................ *H03B 5/364* (2013.01)

(58) Field of Classification Search
CPC .............. H03B 5/30; H03B 5/32; H03B 5/36; H03B 5/362; H03B 5/364
USPC ........... 331/116 FE, 116 M, 116 R, 154, 158, 331/185
See application file for complete search history.

(56) References Cited

U.S. PATENT DOCUMENTS

| | | | |
|---|---|---|---|
| 6,864,756 B2 | 3/2005 | Peng | |
| 7,411,467 B2 | 8/2008 | Alford et al. | |
| 7,616,074 B2 | 11/2009 | Toffolon et al. | |
| 7,924,108 B2 | 4/2011 | Dao et al. | |
| 8,102,217 B2* | 1/2012 | Aoki | H03L 3/00 331/158 |
| 8,120,439 B2* | 2/2012 | Shrivastava | H03B 5/06 331/158 |
| 8,643,445 B1 | 2/2014 | Samala | |
| 8,653,898 B2 | 2/2014 | Lahiri | |
| 8,704,605 B1* | 4/2014 | Sinitsky | H03B 5/362 331/116 FE |
| 2010/0259335 A1 | 10/2010 | Martin | |
| 2014/0210565 A1* | 7/2014 | Vilas Boas | H03L 5/00 331/158 |

FOREIGN PATENT DOCUMENTS

WO   WO-2009/077343   *   6/2009   ............... H03B 5/36

* cited by examiner

*Primary Examiner* — Levi Gannon
(74) *Attorney, Agent, or Firm* — Charles Bergere

(57) ABSTRACT

An oscillator includes an amplifier and a piezoelectric crystal coupled across a portion of the amplifier. A low pass filter (LPF) passes the common-mode voltage component of the crystal output signal. An auxiliary bias circuit uses a shared LPF component to charge a crystal load capacitor during start-up of the oscillator, and to provide a DC bias operating point to the oscillator driver transistor. A buffer amplifier receives the common-mode voltage component on the non-inverting input. The buffer amplifier output is coupled to both the inverting input and the drain terminal of the oscillator driver transistor such that the gate and drain DC bias voltages of the oscillator driver transistor are substantially the same. An automatic loop control circuit receives the crystal output signal and the common-mode voltage signal, and generates a bias control signal to bias the amplifier and the auxiliary bias circuit.

8 Claims, 2 Drawing Sheets

CRYSTAL OSCILLATOR WITH RESISTORLESS FEEDBACK BIASING

BACKGROUND

The present invention relates generally to integrated circuits and more particularly to biasing a crystal oscillator.

Crystal oscillators are ubiquitous in modern electronics. Many electronic devices that have a clock, transmit or receive information, or have other synchronous logic, include a crystal oscillator.

Crystal oscillators have employed a large feedback resistor, coupled across the crystal terminals, to bias the amplifier. The resistor forces the common-mode voltage of the input to the amplifier and the common-mode voltage of the output from the amplifier to be equal. The resistor is often implemented off-chip. Such off-chip components increase the cost of the oscillator. An alternative to an off-chip resistor is to use an on-chip polysilicon resistor. However, to fabricate a polysilicon resistor with a large magnitude of resistance requires a large die area.

Another alternative to the off-chip resistor is to use a metal oxide semiconductor (MOS) transistor with a large channel length, or multiple MOS transistors in series, biased to operate in the linear region. However, the MOS implementation of resistance has large variation with process, voltage and temperature (PVT). The MOS implementation also introduces a large leakage current in the integrated circuit that results in a common-mode voltage difference between the amplifier input and the amplifier output that prevents shaping circuitry from operating properly and results in a distorted output clock duty cycle. Thus, it would be advantageous to have a crystal oscillator circuit that does not require an off-chip resistor yet addresses the above-mentioned limitations.

DETAILED DESCRIPTION

Detailed illustrative embodiments of the present invention are disclosed herein. However, specific structural and functional details disclosed herein are representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

Figure 1:
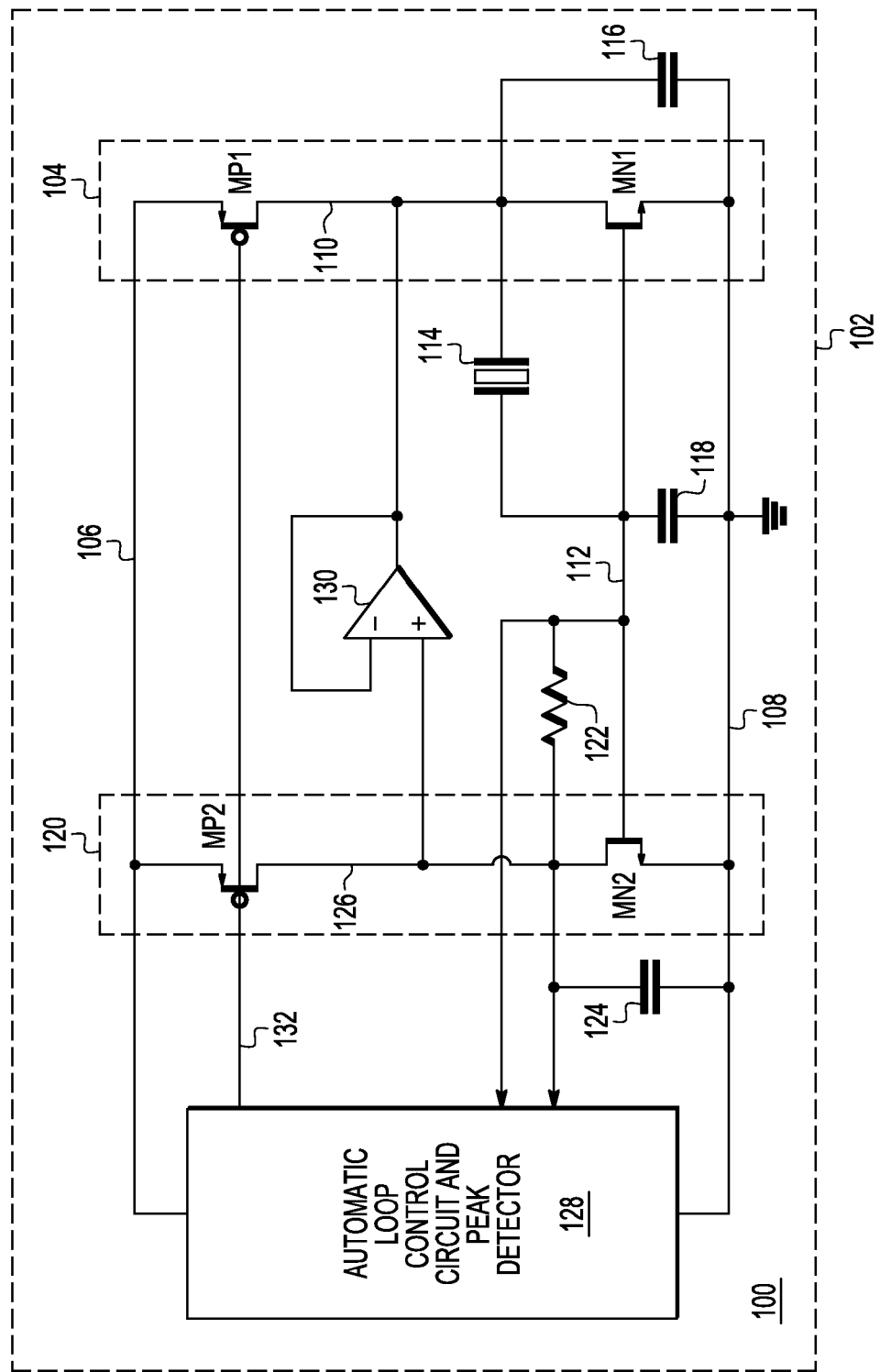
FIG. 1 is a schematic circuit diagram of a crystal oscillator with resistorless feedback biasing in accordance with an embodiment of the invention.

FIG. 1 is a schematic circuit diagram of a crystal oscillator 100 with resistorless feedback biasing in accordance with an embodiment of the present invention. The oscillator 100 is fabricated as part of an integrated circuit 102, such as a System on a Chip (SoC). The oscillator 100 has a main amplifier 104 formed by transistors MP1 and MN1, where MP1 is a p-type transistor MP1 that establishes a bias current in the main amplifier 104 based on a voltage applied to its gate (i.e., the gate of transistor MP1), and MN1 is a n-type oscillator driver transistor. The series conduction paths of the transistors MP1 and MN1 are coupled between a power rail 106 and a low voltage (e.g., ground) rail 108. The drains of the transistors MN1 and MP1 are connected together at a first node 110, which also is an output terminal of the main amplifier 104. The main amplifier 104 has an input terminal at a second node 112.

The main amplifier 104 receives an amplifier input signal provided at the second node 112, which is connected to the gate of transistor MN1 and develops an amplifier output signal at the first node 110, which is at the drain of transistor MN1.

A piezoelectric crystal 114, such as a quartz crystal, is coupled between the main amplifier input terminal at the second node 112 and the main amplifier output terminal at the first node 110. With the main amplifier 104 generating a bias current through transistor MP1 and an input voltage developed at the second node 112, the crystal 114 begins to oscillate, developing an output voltage at the first node 110. While embodiments of the invention are described herein with respect to a quartz crystal, the invention is not limited thereto. Any known piezoelectric crystal will suffice.

A first load capacitor 116 is coupled between the first node 110 and the low voltage rail 108, and a second load capacitor 118 is coupled between the second node 112 and the low voltage rail 108. The capacitances of first and second load capacitors 116 and 118 typically are specified by the crystal vendor.

When the crystal 114 is coupled between the main amplifier output terminal at the first node 110 and the main amplifier input terminal at the second node 112, noise in the circuit 102 and the environment causes the crystal 114 to begin to oscillate provided the main amplifier 104 generates sufficient negative resistance to overcome the losses of the crystal 114. The crystal 114 produces small amplitude oscillations when it first begins to oscillate. As each cycle of the oscillating signal is processed, the crystal output signal at the first node 110 is improved due to operation of the circuitry around the crystal 114. This is said to be the start-up of the oscillator 100.

Eventually the crystal output signal at the first node 110 is as improved as the circuit capability provides (given the operating and input conditions). When the crystal output signal at the first node 110 is repeatable, the oscillator 100 is said to be in a steady state.

The oscillator 100 also has an auxiliary bias circuit 120 formed by a p-type transistor MP2 and an n-type transistor MN2, where a source of MP2 is connected to the supply rail 106, a source of MN2 is connected to the low voltage rail 108, and the drains of MP2 and MN2 are connected together. The transistors MP2 and MN2 of the auxiliary bias circuit 120 are analogous to the transistors MP1 and MN1 of the main amplifier 104 described above using analogous elements that are analogously labeled. The auxiliary bias circuit 120 provides a DC bias operating point at the gate of transistor MN1.

A resistor 122 and capacitor 124 form a low pass filter (LPF). The resistor 122 is connected between the gate of MN2 at the second node 112 and the drain of MN2, while the capacitor 124 is connected between the drain and source of MN2. The resistor 122 receives as an input an output signal of the crystal 114 at the second node 112, and passes a low pass filtered common-mode voltage component to a third node 126 at the connection of the drains of the transistors MN2 and MP2. Values for the resistor 122 and the capacitor 124 are dependent on the crystal oscillator 100 output frequency. For an output frequency in the range of 20 megahertz to 40 megahertz, typical values for the resistor 122 and the capacitor 124 are 50 kilo-ohms and 6 picofarads, respectively. Additional functions provided by the resistor 122 during start-up and operation of the oscillator 100 are discussed below.

The voltage at the second node 112 is filtered by the low pass filter (resistor 122 and capacitor 124) to generate the common-mode voltage at the third node 126, which is coupled as an input to (i) an automatic loop control circuit and peak detector 128 and (ii) a non-inverting input of a buffer amplifier 130. More particularly, the oscillator 100 includes a buffer amplifier 130 having a non-inverting input connected to the third node, an inverting input connected to its output, and the output is connected to the first node 110. Feedback through the buffer amplifier 130 to the crystal 114 is an important part of the improved operation of the crystal oscillator 100. The buffer amplifier 130 has a high open loop voltage gain and is configured as a unity-gain amplifier. At the first node 110, the output of the buffer amplifier 130 establishes a DC bias voltage at the drain of the oscillator driver transistor MN1. The buffer amplifier 130 operates to reduce to zero the difference, if any, between the common mode voltages coupled to its non-inverting and inverting inputs. Hence, using the auxiliary bias circuit 120 and the buffer amplifier 130, the gate and drain DC bias voltages of the oscillator driver transistor MN1 are substantially the same magnitude.

Conventional oscillators commonly use a very large bias resistor, with a resistance in the mega-ohm range, to provide feedback from the output of an oscillator amplifier back to the input of the oscillator amplifier. The present invention provides resistorless feedback biasing. That is, the oscillator does not need a large bias resistor to provide common mode voltage feedback from the output of the oscillator driver transistor MN1 at the first node 110 to the input of the oscillator driver transistor MN1 at the second node 112.

The feedback bias in one embodiment of the invention is achieved by (i) low pass filtering the input of the oscillator driver transistor MN1 at the second node 112 to obtain the common-mode voltage, (ii) coupling the common-mode voltage as the input to the non-inverting input terminal of the buffer amplifier 130, and (iii) coupling the output of the buffer amplifier 130 as the input to the inverting input terminal of the buffer amplifier 130 and the drain of the oscillator driver transistor MN1. Only DC signals or low pass filtered signals are inputs to the non-inverting input terminal of the buffer amplifier 130. The output of the buffer amplifier 130, which is the common mode voltage at the oscillator output terminal (at the first node 110) of the main amplifier 104, is approximately the same as the common mode voltage at the input terminal of the main amplifier 104 (at the second node 112). This feedback maintains the common-mode voltage at the gate and drain of the oscillator driver transistor MN1 equal, or approximately equal, without disturbing dynamic operation of the oscillator 100.

A small voltage difference may exist between the gate and the drain of the oscillator driver transistor MN1 due to a small input offset voltage of the buffer amplifier 130. Over process, temperature and voltage (PVT) variations, the input offset voltage of the buffer amplifier 130 is much smaller than the leakage of a MOS transistor-style feedback resistor making this a more reliable solution.

During start-up, there is a non-zero voltage difference, between signals at the third and first nodes 126 and 110 applied to the non-inverting and the inverting input terminals, to be reduced to zero. As the oscillator 100 begins operation, transient operation is exhibited as the buffer amplifier 130 operates to reduce the difference to approximately zero. When the difference nears zero, the oscillator 100 will exhibit steady-state operation. Reducing the difference to approximately zero causes the common-mode voltage output of the buffer amplifier 130 at the first node 110 to be substantially identical to the low pass filtered common-mode voltage at the third node 126 received on the non-inverting input of the buffer amplifier 130.

Since the output from the buffer amplifier 130 is coupled to the oscillator 100 output (at the first node 110) of the main amplifier 104, the gate and drain DC bias voltages of the oscillator driver transistor MN1 are substantially the same.

Figure 2:
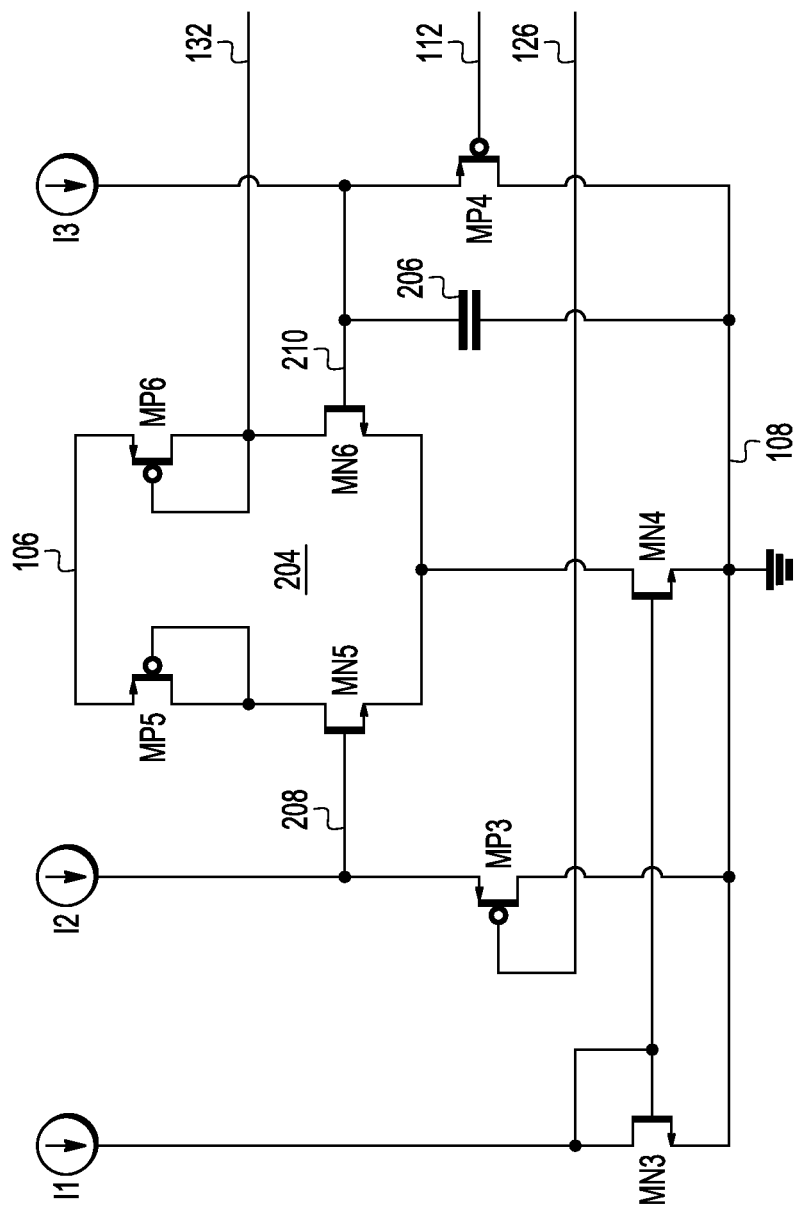
FIG. 2 is a schematic circuit diagram of the automatic loop control circuit and peak detector of FIG. 1.

FIG. 2 is a schematic circuit diagram of the automatic loop control circuit and peak detector 128 used in the crystal oscillator 100 of FIG. 1. Inputs to the circuit 128 include the common-mode voltage at the third node 126 and the crystal output signal at the second node 112. The circuit 128 includes a differential input, differential output amplifier 204, in which one side of the differential output is used as the output.

The differential amplifier 204 incorporates a peak detector and has diode-configured p-type transistors MP5 and MP6 as loads. More particularly, the transistor MP5 has a source connected to the power rail 106 and to the source of the transistor MP6, and a gate connected to its drain. Similarly, the transistor MP6 has its source connected to the power rail 106 and the source of the transistor MP5, and a gate connected to its drain. The differential amplifier 204 also has two N-type transistors MN5 and MN6. The drain of transistor MN5 is connected to the drain of the transistor MP5, while the drain of transistor MN6 is connected to the drain of transistor MP6. The sources of transistors MN5 and MN6 are connected together and to the low voltage rail 108 by way of an N-type transistor MN4.

The differential amplifier 204 is biased by a constant current source, i.e., the N-type transistor MN4, which is arranged in a current mirror configuration with an n-type transistor MN3, which operates in conjunction with a first current source I1. The first current source I1 is connected to the drain and gate of the transistor MN3, and the source of the transistor MN3 is connected to the low voltage rail 108. The gate of the transistor MN3 also is connected to the gate of the transistor MN4. Transistor MN4 has a drain connected to the sources of the transistors MN5 and MN6, and a source connected to the low voltage rail 108.

The circuit 128 receives the common-mode voltage at the third node 126 on the gate of a p-type transistor MP3. The gate voltage of the transistor MP3 modulates current from a second current source I2 and develops, at a fourth node 208, a voltage representative of the common-mode voltage developed at the third node 126. The transistor MP3 has a source connected to the second current source I2, a drain connected to the low voltage rail 108, and a gate connected to the third node 126. The source of the transistor MP3 also is connected to the gate of the transistor MN5 of the differential amplifier 204 at the fourth node 208.

The circuit 128 also has a P-type transistor MP4 that has a source connected to a third current source I3, a drain connected to the low voltage rail 108, and a gate connected to the second node for receiving the crystal 114 output signal. The circuit 128 receives the output signal of the crystal 114 at the second node 112 and thus the gate of a p-type transistor MP4, and modulates current from the third current source I3. A voltage is developed, at a fifth node 210, which is representative of the peak magnitude of the output signal of the crystal 114 as detected by a peak-detector capacitor 206, which is connected between the fifth node 210 and the low voltage rail 108. A typical value for the capacitance of the capacitor 206 is in the range of 5 to 20 picofarads, depending on the frequency of the crystal 114. Note the fifth node 210 is a connection point for a gate of the transistor MN6, a point between the source of the transistor MP4 and the third current source I3, and one terminal of the peak-detector capacitor 206.

The differential amplifier 204 receives as one input the voltage at the fourth node 208 on the gate of the transistor MN5 and receives as another input the voltage at the fifth node 210 on the gate of the transistor MN6. In one embodiment of the invention, the differential amplifier 204 provides, as a bias control signal 132, an output that is the amplified difference between the inputs. The bias control signal 132 is applied to the gates of the transistors MP2 and MP1 (FIG. 1).

The automatic loop control circuit and peak detector 128 produces, in response to the inputs and changes thereto, the bias control signal 132. As shown in FIG. 1, the bias control signal 132 establishes and controls the bias currents generated by the respective transistors MP2 and MP1, which in turn, establishes and controls the gain of the main amplifier 104 and the bias current of auxiliary bias circuit 120.

While the peak detector illustrated in FIG. 2 detects a negative peak magnitude of the output of the crystal 114 at the second node 112, embodiments of the invention are not limited thereto. One skilled in the art would know how to design a peak detector that would detect a positive peak magnitude of the output of the crystal 114. The automatic loop control circuit and peak detector 128 would function equally as well receiving a positive peak magnitude. In the case of detecting a positive peak, the input polarity is reversed to maintain negative feedback in oscillator 100.

The resistor 122 has a primary function, as part of a low pass filter, to generate a common-mode voltage signal as described above. Superimposed on the resistor 122 is a secondary function of charging the second load capacitor 118 during start-up of the crystal oscillator 100 and providing a DC bias operating point at the second node 112 at the gate of the oscillator driver transistor MN1. Using the resistor 122 to also charge the second load capacitor 118 obviates the need for a large biasing resistor and concomitantly reduces the time required for start-up of the crystal oscillator 100.

To achieve a fast start-up, the crystal oscillator 100 initially has a high gain. The bias control signal 132 is coupled to the gate of the p-type transistor MP1 in the main amplifier 104. Increasing the magnitude of the bias control signal 132 decreases the current through the main amplifier 104, and vice versa. Initially the bias control signal 132 is relatively small, providing a relatively large current through the main amplifier 104 and a correspondingly large gain.

In steady state operation, the bias control signal 132 is relatively large, providing a relatively small current through the main amplifier 104 and a correspondingly small gain. In steady-state operation, a smaller gain is sufficient as the crystal oscillator 100 just needs to sustain oscillations. Concomitantly, less power is consumed and there is less oscillator signal distortion.

For the crystal oscillator 100 to operate, the capacitors 116 and 118 must be charged to achieve the DC bias operating points at the nodes 112 and 110, respectively, at the gate and the drain of oscillator driver transistor MN1. Upon powering-up the integrated circuit 102, and hence the crystal oscillator 100, the automatic loop control circuit and peak detector 128 generates the bias control signal 132, which is applied to the gate of the transistor MP1 in the main amplifier 104 and also to the gate of the transistor MP2 in the auxiliary bias circuit 120, as described above.

Bias currents are generated by the transistor MP1 in the main amplifier 104 and by the transistor MP2 in the auxiliary bias circuit 120. The magnitudes of the respective bias currents are dependent not only on the magnitude of the bias control signal 132, which, in one embodiment of the invention, is applied to the gate of each of the transistors MP1 and MP2, but also the magnitudes of the respective bias currents are dependent on the width-to-length ratios of the channels of the respective transistors MP1 and MP2.

In certain implementations, the sizes of the transistors MP2 and MN2 are substantially smaller than the sizes of the corresponding transistors MP1 and MN1. The width to length ratio of the channels of the transistors MP2 and MN2 in the auxiliary bias circuit 120 are, in one embodiment of the invention, $1/150^{th}$ of the width to length ratio of the channels of the corresponding transistors MP1 and MN1 in the main amplifier 104, although the invention is not limited thereto. In other embodiments of the invention, the width to length ratio of the channels and thus the sizes of the transistors MP2 and MN2 in the auxiliary bias circuit 120 typically range from $1/100^{th}$ to $1/200^{th}$ of the sizes of the corresponding transistors MP1 and MN1.

When the crystal oscillator 100 is initially powered, the gate of the oscillator driver transistor MN1 (i.e., at the second node 112) and drain (i.e., at the first node 110) are at the potential of the low-voltage rail 108, ostensibly ground potential. The automatic loop control circuit and peak detector 128 will generate the initial bias control signal 132 corresponding to the initial oscillator circuit conditions. The bias control signal 132 is provided to the transistor MP2 in the auxiliary bias circuit 120 and simultaneously to the transistor MP1 in the main amplifier 104.

In the auxiliary bias circuit 120, the transistor MP2 charges the capacitor 118 through the resistor 122 to achieve a DC operating point at the gate of the oscillator driver transistor MN1. The voltage at the second node 112 is filtered using the resistor 122 and the capacitor 124 as a low pass filter to generate the low pass common-mode voltage at the third node 126. With the buffer amplifier 130 configured as a unity gain voltage follower, the voltage at the third node 126 is coupled to the non-inverting input of the buffer amplifier 130. The output of the buffer amplifier 130 is presented at the drain 110 of the oscillator driver transistor MN1 (at the first node 110). The common mode voltage of the input (at the second node 112) and the output (at the first node 110) of the main amplifier 104 are substantially equal without using a large bias resistor.

The auxiliary bias circuit 120 requires very little area on the die of the integrated circuit 102, and in operation, the auxiliary bias circuit 120 consumes correspondingly little power. The relatively small time constant of the resistor 122 and the capacitor 118, results in the capacitor 118 charging rapidly, which permits both the input and the output (at the second and first nodes 112 and 110) of the main amplifier 104 common mode voltage to reach their steady-state operating values quickly, thereby providing a fast start-up of the oscillator 100.

The resistor 122 provides multiple functions of facilitating the charging of the capacitor 118 during the oscillator 100 start-up and providing, then maintaining the oscillator driver transistor MN1 input bias and also functioning as a low pass filter component, in conjunction with the capacitor 124, to filter the output (at the second node 112) during start-up and during steady-state operation, to generate the common-mode voltage 126 from the output (at the second node 112). Furthermore, this technique scales from one technology node to a next, smaller technology node, and the start-up time across all process, voltage, and temperature variations is faster than conventional resistor bias techniques.

For purposes of this description, the terms "couple," "couples," "coupling," "coupled," "connect," "connects," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding nodes, ports, or paths may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "channel node" refers generically to either the source or drain of a metal-oxide semiconductor (MOS) transistor device (also referred to as a MOSFET), the term "channel" refers to the path through the device between the source and the drain, and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when an embodiment of the invention is implemented using bi-polar transistor technology.

It should be appreciated by those of ordinary skill in the art that any block diagrams herein represent conceptual views of illustrative circuitry embodying the principles of the invention.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components.

It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. An oscillator that generates oscillator output signals at first and second oscillator output terminals of the oscillator, the oscillator comprising:
   an amplifier coupled between a power rail and a low-voltage rail;
   a piezoelectric crystal having first and second terminals, the crystal coupled across a portion of the amplifier with the first and second crystal terminals coupled to the first and second oscillator output terminals;
   a load capacitance coupled between the first oscillator output terminal and the low-voltage rail;
   a low pass filter (LPF) coupled to the first oscillator output terminal, wherein the LPF passes a common-mode voltage component to a LPF output terminal, and wherein the LPF has a shared LPF component;
   an auxiliary bias circuit coupled to the first oscillator output terminal for charging the load capacitance using the shared LPF component during start-up of the oscillator and maintaining the amplifier biased to an operating point;

a buffer amplifier having a non-inverting input terminal, an inverting input terminal, and an output terminal, wherein:

the LPF output terminal is coupled to provide the common-mode voltage component to the non-inverting input terminal of the buffer amplifier; and the output terminal of the buffer amplifier is coupled to the inverting input terminal of the buffer amplifier, and to the second oscillator output terminal; and an automatic loop control (ALC) circuit coupled (i) to the first oscillator output terminal to receive an oscillator output signal and (ii) to the LPF output terminal to receive the common-mode voltage component, the ALC circuit generating a bias control signal based on the received oscillator output signal and the common-mode voltage component to bias the amplifier and the auxiliary bias circuit.

2. The oscillator of claim 1, wherein the shared LPF component comprises a resistor.

3. The oscillator of claim 1, wherein transistors in the auxiliary bias circuit have substantially smaller size than corresponding transistors in the amplifier.

4. The oscillator of claim 3, wherein the size of the transistors in the auxiliary bias circuit range from approximately $1/100^{th}$ to approximately $1/200^{th}$ of the size of the corresponding transistors in the amplifier.

5. The oscillator of claim 1, wherein the piezoelectric crystal comprises a quartz crystal.

6. The oscillator of claim 1, further comprising:

a peak detector coupled to the first oscillator output terminal to detect a peak magnitude of the received oscillator output signal, wherein the ALC circuit develops the bias control signal based on the peak magnitude of the received oscillator output signal in addition to the common-mode voltage component.

7. The oscillator of claim 6, wherein the peak magnitude of the received oscillator output signal is a negative magnitude.

8. An integrated circuit including the oscillator as recited in claim 1.

* * * * *